United States Patent [19]
Anderson

[11] Patent Number: 6,108,491
[45] Date of Patent: Aug. 22, 2000

[54] DUAL SURFACE REFLECTOR

[75] Inventor: Roger N. Anderson, San Jose, Calif.

[73] Assignee: Applied Materials, Inc., Santa Clara, Calif.

[21] Appl. No.: 09/183,796

[22] Filed: Oct. 30, 1998

[51] Int. Cl.[7] .................................................. H01L 21/205
[52] U.S. Cl. ..................... 392/418; 392/416; 392/411; 392/422; 219/405; 118/725
[58] Field of Search ..................... 219/405, 411, 219/390; 392/416, 422, 411, 412, 418, 423, 413, 424, 425; 250/492.22; 118/725, 50.1, 724; 362/297, 315

[56] References Cited

U.S. PATENT DOCUMENTS

| | | | |
|---|---|---|---|
| 2,387,804 | 10/1945 | Miskella | 392/411 |
| 4,493,977 | 1/1985 | Arai et al. . | |
| 4,832,777 | 5/1989 | Davis . | |
| 5,108,792 | 4/1992 | Anderson et al. | 118/715 |
| 5,179,677 | 1/1993 | Anderson et al. | 392/411 |
| 5,248,636 | 9/1993 | Davis et al. | 437/225 |
| 5,345,534 | 9/1994 | Najm et al. | 392/422 |
| 5,399,523 | 3/1995 | Kakoschke . | |
| 5,436,172 | 7/1995 | Moslehi | 437/8 |
| 5,446,825 | 8/1995 | Moslehi et al. . | |
| 5,467,220 | 11/1995 | Xu . | |
| 5,556,275 | 9/1996 | Sakata et al. . | |
| 5,595,241 | 1/1997 | Jelinek . | |
| 5,762,713 | 6/1998 | Paranjpe | 118/725 |
| 5,792,273 | 8/1998 | Ries et al. . | |
| 5,856,652 | 1/1999 | Mayuzumi . | |
| 5,930,456 | 7/1999 | Vosen | 392/416 |
| 5,937,142 | 8/1999 | Moslehi et al. | 392/416 |

FOREIGN PATENT DOCUMENTS

| | | |
|---|---|---|
| 0695922 | 7/1996 | European Pat. Off. . |
| 59-34627 | 2/1984 | Japan . |
| 59-36927 | 2/1984 | Japan . |
| 799737 | 4/1995 | Japan . |
| 2181459 | 4/1987 | United Kingdom . |

*Primary Examiner*—John A. Jeffery
*Attorney, Agent, or Firm*—Blakely Sokoloff Taylor & Zafman

[57] ABSTRACT

A dual surfaced mid-reflector employs two independently shaped faceted faces to direct radiant energy from separate heater lamp arrays to a substrate or substrate support to be heated. A dual surfaced mid-reflector can also be employed in conjunction with a peripheral cylindical reflect or and a central cylindrical reflector to further direct radiation to specific regions on a substrate or substrate support. In addition, a dual surfaced mid-reflector can also be employed in conjunction with heater lamps where the radiation of individual lamps is further directed by focusing reflectors or dispersive reflectors.

30 Claims, 11 Drawing Sheets

| Fig. Number "Configuration" | Mid-Reflector Configurations | | | | | |
|---|---|---|---|---|---|---|
| | Outer Face | | Inner Face | | | |
| | First Facet | Second Facet | First Facet | | Second Facet | |
| Fig. 1 "Diverging, Equal Compound" | diverging about 5 degrees from axis 115 and 1st and 2nd facets are of equal length | parallel to axis 115 and 1st and 2nd facets are of equal length | diverging about 20 degrees from axis 115 and 1st and 2nd facets are equal length | | converging about 20 degrees towards axis 115 and 1st and 2nd facets are equal length | |
| Fig. 8 "Double, Parallel" | parallel to axis 115 | N/A | parallel to axis 115 | | N/A | |
| Fig. 9 "Double, Converging" | converging about 10 degrees towards axis 115 | parallel to axis 115 | converging about 10 degrees towards axis 115 | | parallel to axis 115 | |
| Fig. 10 "Diverging, Compound" | diverging about 3 degrees away from axis 115 | parallel to axis 115 | diverging about 18 degrees from axis 115 | | converging about 6 degrees towards axis 115 and 2nd facet longer than 1st facet | |
| Fig. 11 "Compound, Converging" | converging about 18 degrees towards axis 115 | diverging about 6 degrees away from axis 115 and 2nd facet longer than 1st facet | converging about 3 degrees towards axis 115 | | parallel to axis 115 | |
| Fig. 12 "Double, Compound" | converging about 30 degrees towards axis 115 | diverging about 8 degrees away from axis 115 and 2nd facet longer than 1st facet | diverging about 18 degrees away from axis 115 | | converging about 5 degrees towards axis 115 and 2nd facet longer than 1st facet | |

FIG. 7

DUAL SURFACE REFLECTOR

FIELD OF THE INVENTION

The field of this invention relates generally to semiconductor manufacturing, and more particularly, to a method and an apparatus for directing energy to a susceptor or a semiconductor workpiece.

BACKGROUND OF THE INVENTION

The present invention relates generally to energy sources useful in thermal processing apparatuses, more particularly to radiant heaters used in the rapid thermal processing of semiconductor workpieces or substrates, and especially to an apparatus and a method for heating semiconductor substrates during chemical vapor deposition (CVD) processes, including epitaxial reaction processes. Accordingly, it will be understood that when reference is made in the remainder of this application to CVD or epitaxial reaction processes, these are merely prime examples of the wider range of thermal processes to which the teachings of the present invention are applicable.

The commercial production of semiconductor devices has in recent times been placed under increasing pressure to reduce the cost per device. This in turn has required new measures to increase the efficiency of epitaxial processing methods so that they yield higher throughput of acceptable devices at a lower cost per device. Important developments in this regard are the use of radial heating arrays to improve heating efficiency and a compact, double-dome reactor which achieves increased processing speed and while reducing consumption of the gases used in semiconductor processing operations.

A representative double-dome apparatus is fully detailed in U.S. Pat. No. 5,108,792 entitled "Double Dome Reactor for Semiconductor Processing" which is commonly assigned with the present invention. The reactor system utilized in this cited patent is efficient enough to permit economic processing of even a single wafer per processing operation. The central concepts of this double dome reactor system may be summarized as follows: (1) support the substrate on a thin, low thermal mass susceptor for rapid heating and cooling; (2) enclose the substrate and susceptor in a compact housing having a pair of transparent domes, each dome covering one face of the susceptor-substrate combination; (3) provide conduits for reactant gases to enter and exit the housing; (4) provide a pair of radiant heaters arranged to project energy through each of the transparent domes to uniformly heat each face of the susceptor-substrate combination.

Representative radial heater arrays are fully detailed in U.S. Pat. No. 5,179,677 entitled "Apparatus and Method for Substrate Heating Utilizing Various Infrared Means to Achieve Uniform Intensity" which is commonly assigned with the present invention. The central concepts of the above cited patent is the reduction in heater complexity by utilizing: (1) a plurality of linear, tubular heater lamps; (2) providing focusing reflectors which cause thermal radiation to be directed in parallel paths towards the substrate resulting in greater thermal radiation near the center of the substrate or susceptor; (3) providing dispersive reflectors which cause thermal radiation to be dispersed in a hemispherical pattern and (4) providing a peripheral reflector circuferentially surrounding the lamps and their associated reflectors to intercept some of the dispersed radiation and redirect it to the periphery rather than at the center of the substrate or susceptor in order to balance the radiation pattern of the focusing reflectors.

While reactor systems utilizing the double dome reactor and radial heater arrays have proven highly efficient in reducing processing costs and increasing throughput, work has continued on further improvements driven by the semiconductor industry's trend toward increasing wafer or semiconductor workpiece diameters. Early wafers had diameters of 25 mm or less, while today the industry faces the migration from 200 mm wafers to 300 mm wafers. The trend toward larger wafer sizes is moderated by the added difficulty of obtaining the uniform heating required to maintain higher yields while utilizing ever increasing substrate diameters. The migration from 200 mm diameter to 300 mm diameter susceptors and substrates results in a larger surface area over which rapid, uniform thermal gradients and radiation patterns need to be employed. The semiconductor industry's previous substrate diameter increase from 150 mm to 200 mm—a surface area increase of 180%—necessitated improvements such as the double-dome reactor and radial arrays described in the aforementioned patents.

However, increasing the number and power of lamps used in radial arrays only partially solves the problem since the amount and degree of interference caused by interference between lamps in the various arrays increases proportional to the number of lamps utilized. The resulting interference results in heating inefficiencies which hinder thermal processing performance and diminish overall system throughput. What is needed to solve the difficulties posed by the 225% surface area increase presented by the migration to 300 mm diameter substrates and susceptors is a radiation directing device which effectively utilizes energy from multiple heater arrays. Such a device would thereby provide the higher energy necessary for high throughput thermal processing of existing and larger diameter substrates and susceptors.

These and other disadvantages of the prior art are overcome by the present invention directed to a method and an apparatus which can increase the efficiency of and further improve upon the uses for multiple energy sources to uniformly and rapidly heat existing and larger diameter susceptors and substrates. Such an apparatus increases the efficiency of radial heater arrays thereby reducing over system power consumption while maintaining rapid thermal processing capabilities.

SUMMARY OF THE INVENTION

In accordance with the present invention, there is disclosed a dual surfaced mid-reflector apparatus for directing and uniformly providing energy from multiple energy sources, such as IR or UV lamps, to advantageously selected portions of susceptors and semiconductor workpieces. More precisely, the present invention is directed to an improved method and apparatus which utilizes a dual faced reflector positioned between multiple radiation sources to independently direct energy from each energy source to a predetermined region of a susceptor or semiconductor workpiece.

In an embodiment of the present invention, a directing device which has at least two advantageously shaped reflective surfaces is positioned to intercept incoming energy from at least two separate energy sources. The shape of each reflective surface is independently determined such that one face can direct energy from one source to a predetermined location on a receiving surface and another face can direct energy from another source to another predetermined location on a receiving surface.

In another embodiment of the present invention, a dual sided reflector is advantageously positioned so as to direct incoming radiant energy from separate energy arrays onto specific regions on a susceptor. The shape of each side or face of the reflector is independently determined so that incident radiation to that side is directed towards a particular susceptor region.

In another embodiment of the present invention, central and peripheral reflectors are utilized in conjunction with a mid-reflector of the present invention to create regions of directed radiation. As a result, a first region of directed energy comprises radiation from a first plurality of energy sources which is directable by a peripheral reflector and one face of the mid-reflector of the present invention. A second region of directed energy comprises radiation from a second plurality of energy sources which is directable by a central reflector and another face of a mid-reflector of the present invention. Additionally or alternatively, each radiant energy source or lamp in each of the plurality of radiant energy sources is further directable by utilizing dispersive or focusing reflectors.

In another alternative embodiment of the present invention, energy from multiple radial arrays positioned above a susceptor or semiconductor workpiece are directed onto predetermined regions of a susceptor or semiconductor workpiece by a dual sided mid-reflector of the present invention. Additionally or alternatively, energy from multiple radial arrays positioned below a susceptor are directed onto predetermined regions of the susceptor by a dual sided mid-reflector of the present invention.

Major objectives of the present invention are the increased efficiency of multiple heaters can be utilized to provide rapid thermal processing and uniform radiation distribution on existing and larger diameter susceptors and semiconductor workpieces. Increased heater source utilization provided by the method and apparatus of the present invention leads to enhanced wafer through-put by allowing larger diameter workpieces to be processed efficiently and quickly in spite of the increased thermal mass resulting from larger diameter susceptors and semiconductor workpieces.

BRIEF DESCRIPTION OF THE DRAWINGS

Other objectives, features and advantages of the present invention will become apparent upon consideration of the specification and the drawings, in which:

FIG. 7 is a table summarizing the representative embodiments of dual surfaced reflectors according to the present invention.

DETAILED DESCRIPTION OF THE PRESENT INVENTION

Figure 1:
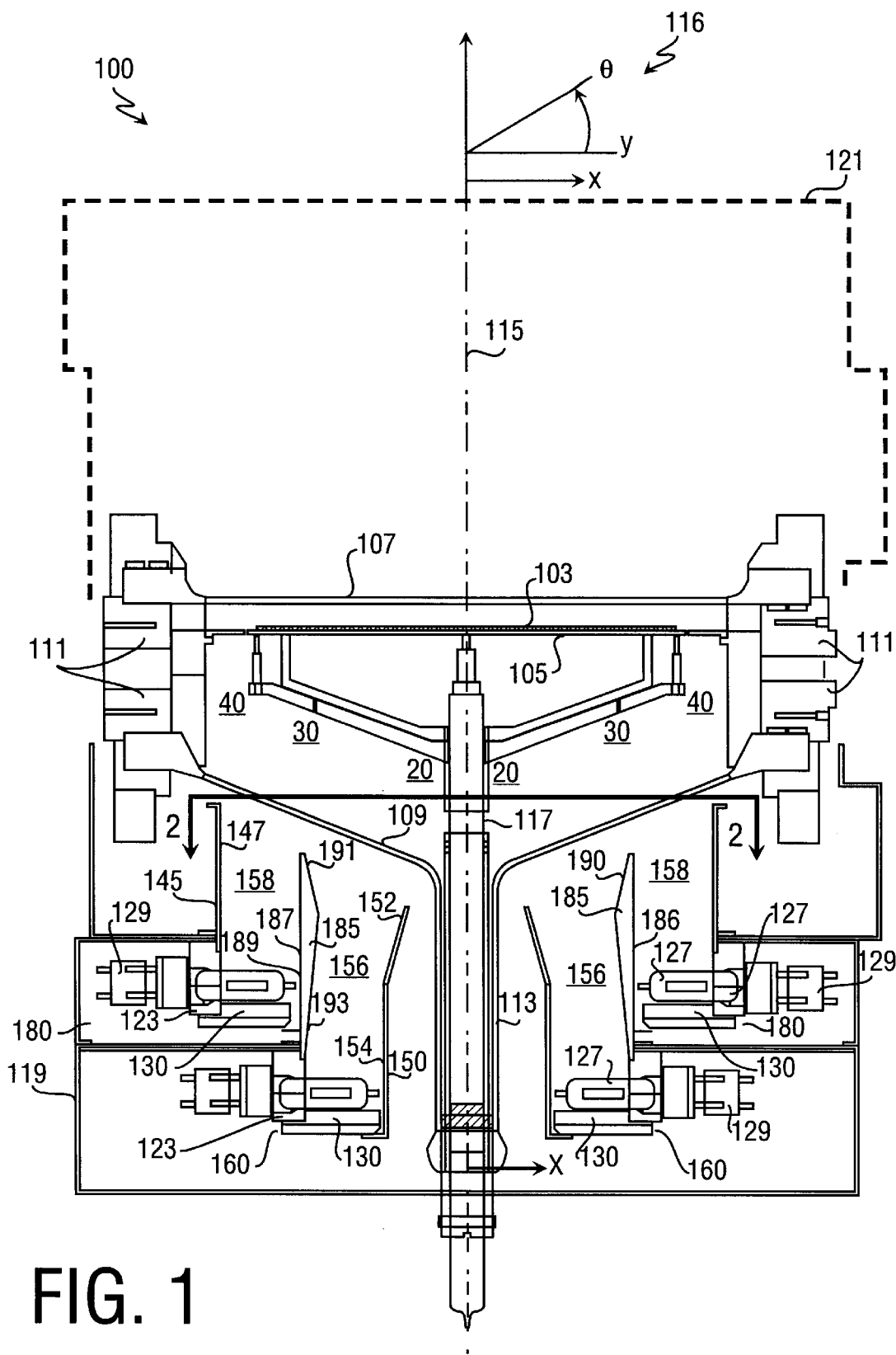
FIG. 1 is a cross-sectional view of a processing reactor utilizing a converging, equal compond embodiment of the present invention.

In FIG. 1, a chemical vapor deposition chamber (CVD) reactor vessel or other rapid thermal processing apparatus 100 is illustrated in a simplified and schematic form. A workpiece or semiconductor substrate 103, which might be a thin wafer of silicon having a diameter of 300 mm, for example, is supported on a susceptor 105 mounted within the processing chamber within the reactor vessel 100. Susceptor 105 is made, for example, of graphite and is in the form of a thin disc such that it has relatively low thermal mass. Susceptor 105 has a diameter larger than the diameter of the workpiece to be processed. Thus, for the 300 mm workpiece 103 of FIG. 1, susceptor 105 would have a diameter greater than 300 mm. Representative diameters could be between 310 to 380 mm or about 370 mm.

For purposes of further describing the radiation patterns generated within apparatus 100, susceptor 105 is divided into three regions, namely: a central region 20, a periphery region 40 and a mid-radius region 30. The regions are concentric and symmetrical about axis 115. Central region 20 describes a circular area in the center-most portion of susceptor 105. Periphery region 40 describes an annular area along the outer edge of susceptor 105. Mid-radius region 30 describes an annular area approximately half-way between the center and the edge of susceptor 105 which is bounded by the outer most boundary of central region 20 and the center most boundary of periphery region 40. Although described in relation to a susceptor 105, central 20, mid-radius 30 and periphery 40 regions are applicable to a substrate 103 disposed on a susceptor 105 as in, for example, during processing operations within apparatus 100.

Figure 1A:
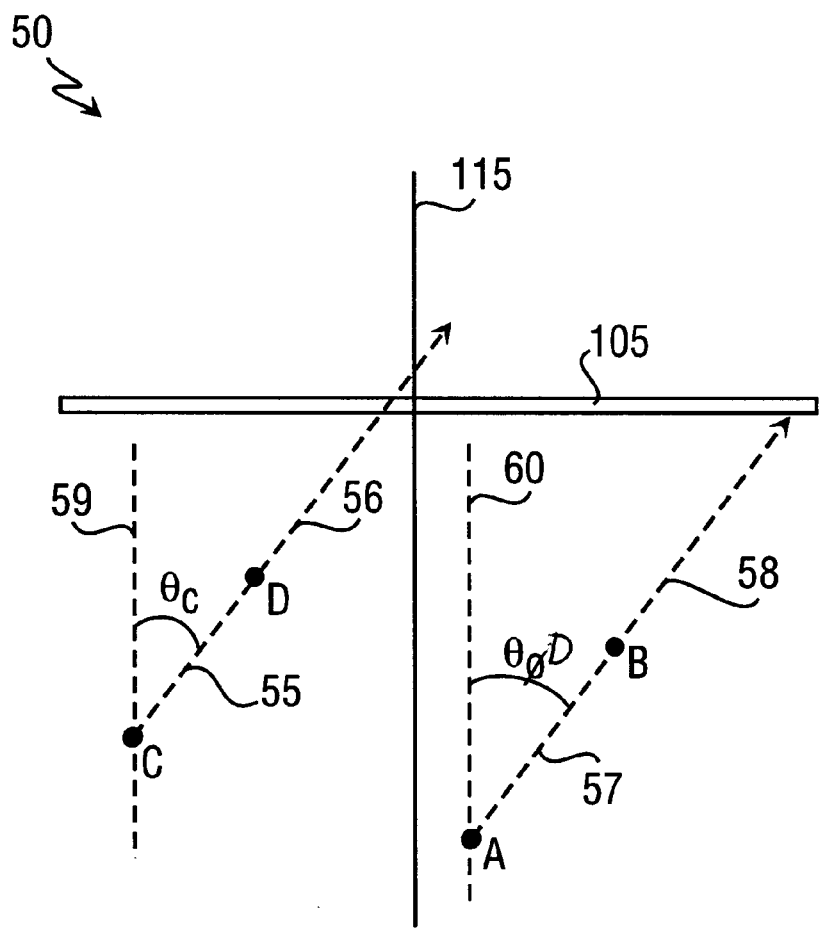
FIG. 1A is an angle reference system.

Turning now to FIG. 1A, in order to better describe the relationship between the various reflective surfaces within apparatus 100, they will be described according to angle reference system 50 of FIG. 1A which utilizes symmetrical axis 115 and susceptor 105 as reference points. For example, surfaces or facets of surfaces can be referred to as converging towards axis 115, diverging from axis 115, parallel to axis 115 or normal to axis 115. Illustrative reflective surface 55 is considered converging towards axis 115 because a vector 56 originating from the point C on the surface 55 furthest away from susceptor 105 intersects axis 115 when vector 56 is extended towards and beyond the point D on the surface 55 which is nearest susceptor 105. Conversely, illustrative reflective surface 57 is considered diverging from axis 115 because a vector 58 originating from the point A on surface 57 furthest away from susceptor 105 does not intersect axis 115 when vector 58 is extended towards and beyond the point B on surface 57 nearest susceptor 105.

The degree of convergence or divergence for a particular surface is indicated by the magnitude of the angle whose sides are formed by the particular surface and a line parallel to axis 115 and whose vertex is located where the line parallel to axis 115 intersects the point on the surface furthest from susceptor 105. Referring again to angle reference system 50, $\theta_C$ describes the angle of convergence for surface 55. The sides of $\theta_C$ are formed by surface 55 and a line 59 parallel to axis 115. The vertex of $\theta_C$ is where line 59 crosses surface 55 at a point C on surface 55 which is furthest from susceptor 105. $\theta_D$ describes the angle of divergence for surface 57. The sides of $\theta_D$ are formed by surface 57 and a line 60 parallel to axis 115. The vertex of $\theta_D$ is where line 60 crosses surface 57 at a point A on surface 57 which is furthest from susceptor 105.

Referring again to apparatus 100 of FIG. 1, an upper window 107 made of a transparent material such as quartz, for example, encloses the top surface of substrate 103 and susceptor 105 while a lower domed window 109 encloses the bottom surface thereof. Base plates 111, illustrated in a simplified schematic form, are used to join windows 107 and 109 forming a gas-tight joint.

Although each of the windows 107 and 109 might be provided with a tubular neck and domed shape as in the aforementioned "Double-Dome Reactor" U.S. Pat. No. 5,108,792, only lower domed window 109 has been illustrated as such with tubular neck 113 located on the axis of cylindrical symmetry 115 of the apparatus 100. In operation, process and cleaning gases are provided into apparatus 100 via ports (not shown) formed within base plates 111 as described in the aforementioned "Double-Dome Reactor" U.S. Pat. No. 5,108,792. Gases enter apparatus 100 via an inlet port on one side of apparatus 100, flow across susceptor 105 and substrate 103 in a substantially laminar flow and then exit via an exhaust port opposite to the inlet port.

A support shaft 117 extends upwardly within the neck 113 of lower domed window 109 along axis 115 which is attached to and supports susceptor 105. Shaft 117 and susceptor 105 may be rotated during processing operations by a motor (not shown).

The reactor heater system of apparatus 100 comprises a lower heat source 119 and an upper heat source 121 (shown in phantom outline). Upper 121 and lower 119 heat sources are positioned adjacent to upper 107 and lower 109 covers respectively for the purpose of heating substrate 103 and susceptor 105 during processing operations conducted within apparatus 100. Lower heat source 119 includes an inner array 160 of infrared radiation bulbs 127 and an outer array 180 of infrared radiation bulbs 127. Bulbs 127 could be, for example, 2 kW tungsten filament infrared bulbs which are about four inches long with a diameter of about 1.25 inches. Electrical interfacing for bulbs 127 is provided by sockets 129. Lower heat source 119 also includes a peripheral reflector structure 145 which provides for mechanical attachment of bulbs 127 as well as reflective surface 147 to enhance directivity of radiation generated by bulbs 127 within outer array 180. For the processing apparatus 100 of FIG. 1, peripheral reflector 145 could be about 4.5 inches in height and formed from a rigid, thermally durable material such as aluminum or brass. Additionally, the reflective surfaces of peripheral reflector 145 are coated with a material having good reflective qualities for infrared radiation such as gold or copper.

Inner array 160 has a smaller diameter than outer array 180. Inner array 160 circumscribes the central portion of substrate support 105 or substrate 103. Outer array 180 circumscribes the periphery of substrate support 105 and substrate 103 and as such has a diameter about as large or larger than that of both substrate 103 and support 105. Both inner and outer arrays are disposed within planes substantially parallel to but vertically disposed from substrate 103 and susceptor 105. In a reactor 100 designed to process substrates having 300 mm diameters, for example, inner array 160 could be disposed about 16 inches from susceptor 105 and have a diameter of between about 220 mm to 280 mm. Outer array 180 could be disposed about 12 inches from susceptor 105 and have a diameter of between about 360 mm to 420 mm.

One aspect of the present invention is mid-reflector 185 which comprises an outer face 186 and an inner face 190. Mid-reflector 185 is formed from a rigid, thermally durable material such as, for example, aluminum or brass. Additionally, outer face 186 and inner face 190 are coated with a material having good reflective qualities for reflecting infrared radiation such as gold or copper. Mid-reflector 185 is sufficiently tall such that it can reduce interference between the radiation generated by inner array 160 and outer array 180 while directing the radiation from each array. For the representative 300 mm processing apparatus 100 of FIG. 1 where inner and outer arrays 160 and 180 have diameters of 10 inches and 15.5 inches respectively, mid-reflector 185 could be about 7.5 inches high with a diameter of about 11 inches. Thus, one advantage of mid-reflector 185 is the reduction of interference between inner array radiation and outer array radiation thereby increasing the effectiveness and directivity of each array. The efficiency of each array is further enhanced by employing mid-reflector 185 in combination with other reflective chamber surfaces such as peripheral 145 and central 150 reflectors to form inner and outer directed radiation zones 156 and 158.

Outer directed radiation zone 158 is created by advantageously selecting the length and angle of first and second facets 187 and 189 of mid-reflector outer surface 186 which is used in conjunction with peripheral reflector reflective surface 147. It will be also be appreciated that additional reflective combinations can be created by altering peripheral reflector surface 147 into conical shapes thereby presenting an additional angled surface towards outer directed radiation zone 158. The resulting reflective combinations direct radiation generated by the bulbs 127 of outer array 180 onto predetermined and advantageously selected portions of substrate support 105 such as peripheral region 40 and mid-radius region 30.

Inner directed radiation zone 156 is created by advantageously selecting the length and angle of first and second facets 191 and 193 of mid-reflector inner surface 190 which is used in conjunction with first and second reflective surfaces 152 and 154 of central reflector 150. The resulting reflective combinations direct radiation generated by the bulbs 127 of inner array 160 onto predetermined and advantageously selected portions of substrate support 105 such as central region 20 and mid-radius region 30. Thus, the advantageously selected reflective surfaces of mid-reflector 185 more efficiently direct radiation from concentric arrays 160 and 180 onto advantageously selected susceptor regions. As a result, mid-reflector 185 thereby improves the rapid, uniform heating characteristics of concentric radial heating arrays such as arrays 160 and 180 of heater 119 such that the relatively larger thermal masses associated with 300 mm diameter susceptors and substrates may be efficiently utilized in wafer fabrication processes.

Upper heat source 121 could also comprise similar radiation bulbs 127, inner and outer arrays 160 and 180 as well as the reflective structures, such as peripheral reflector 145, mid-reflector 185 and central reflector 150 described above in relation to lower heat source 119. Alternatively, upper heat source 121 could also comprise a single radial array. The symmetric design of the double-dome reactor allows lower heater source 119 to project thermal radiations in a direction generally along axis 115 towards susceptor 105 and substrate 103 from below while at the same time upper heater source 121 (shown in phantom outline) directs radiation generally parallel to axis 115 towards substrate 103 and susceptor 105 from above. Heat sources 119 and 121 heat substrate 103 and susceptor 105 to processing temperatures in the range of 500 to 1200 degrees Celsius.

By transmitting energy both from above and below substrate 103 greater total energy can be achieved for a maximum local energy. High local energies are to be avoided because they can cause the heat sources and the chamber walls to heat unevenly and possibly break. Greater total energy is desired to provide more rapid heating within chamber 100.

Another advantage of using upper and lower heat sources 121 and 119 is detailed in the aforementioned U.S. Pat. No. 5,108,792 entitled "Double-Dome Reactor For Semiconductor Processing" which describes how the relative temperatures of wafer 103 and substrate support 105 can be controlled. Accordingly, heating sources 119 and 121 can be independently controlled and adjusted so that wafer 103 is hotter than susceptor 105, avoiding backside migration. Where backside migration is desired, for example to seal dopant in wafer 103, lower heat source 119 can operate at relatively a higher level so that susceptor 105 is hotter than wafer 103. Furthermore, radiation from inner and outer arrays 160 and 180 can further be controlled by center, edge and main variable power supplies as described in the above mentioned U.S. Pat. No. 5,179,677 entitled "Apparatus and Method for Substrate Heating Utilizing Various Infrared Means to Achieve Uniform Intensity".

Thermal reactor 100 is characterized by a high degree of cylindrical uniformity since upper and lower covers 107 and 109, susceptor 105, substrate 103, peripheral reflector 145, mid-reflector 185, central reflector 150, upper and lower as well as inner and outer lamp arrays 160 and 180 are coaxial about a common axis 115. Axis of cylindrical symmetry 115 corresponds to the Z axis of the cylindrical (r, θ, z) coordinate system which is designated 116 at the top of FIG. 1. Accordingly, circumferential uniformity of temperature of wafer 103 is readily obtained. In other words, in the cylindrical (r, θ, z) coordinate system at any given radius r of wafer 103, the temperature variations in the θ direction are negligible. Since arrays 160 and 180 are not continuous, but rather comprise discrete elements (bulbs 127) some variation in energy in the θ direction is expected. However, overlap of radiant energy provided by bulbs 127 smoothes the energy flow thereby reducing this variation and providing methods and apparatuses of the present invention suitable for use in rotating and non-rotating susceptor processing systems.

Flexibility and efficiency of radial uniformity (in the r direction) is provided by the use of dual circular arrays 160 and 180 in each heat source 119 and 121. For example, the radial profile of radiant heat from lower source 119 can be controlled by adjusting the intensity of inner array 160 relative to that of outer array 180 by employing, for example, the variable and balance power supplies described in U.S. Pat. No. 5,179,677 entitled "Apparatus and Method for Substrate Heating Utilizing Various Infrared Means to Achieve Uniform Intensity". Additional flexibility and efficiency of radial uniformity is provided by advantageously selecting the facets of each face of mid-reflector 185 in order to further direct the radiation from inner and outer arrays 160 and 180.

Figure 2:
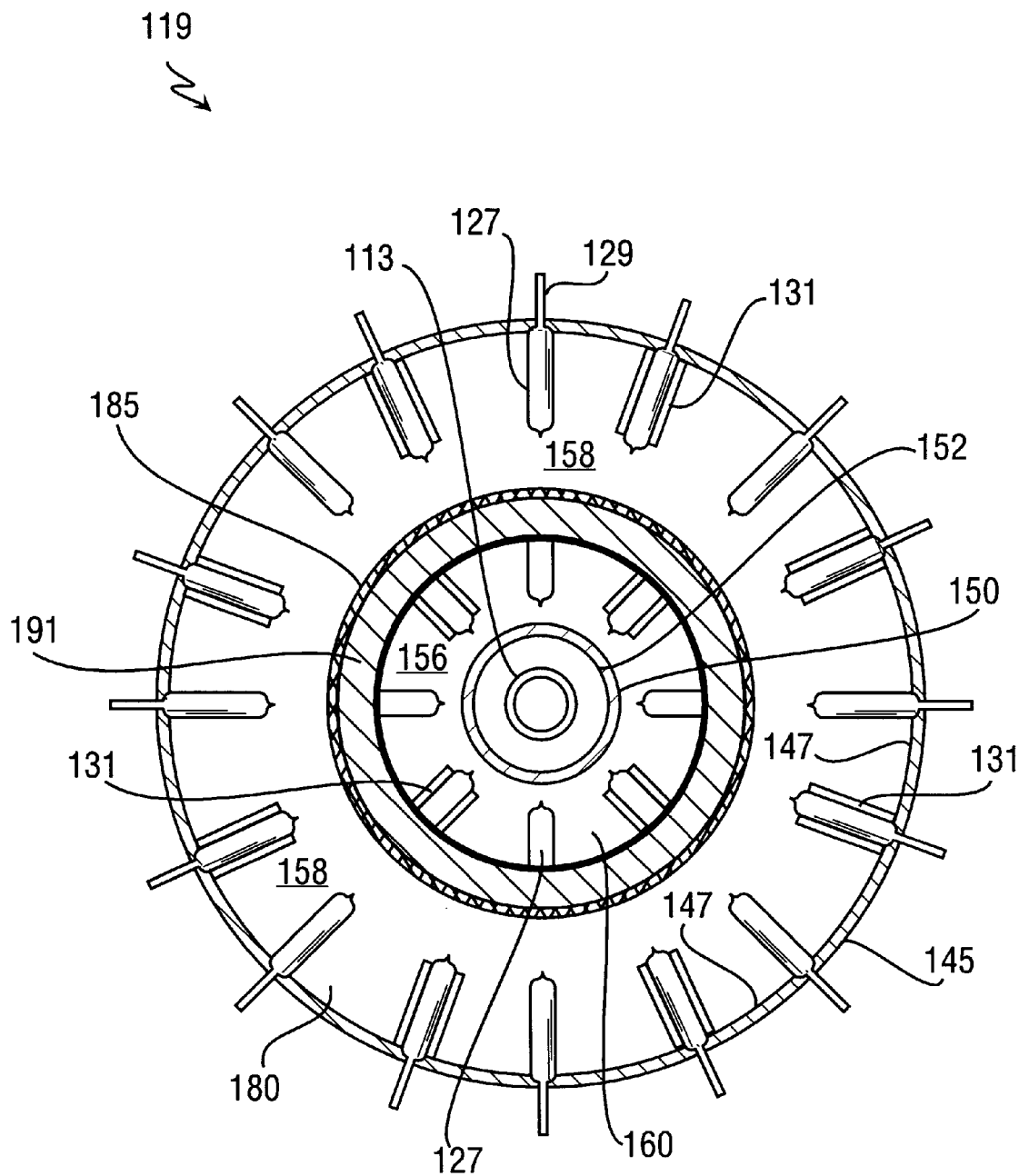
FIG. 2 is a plan view of processing reactor of FIG. 1 taken along section 2—2 of FIG. 1.

FIG. 2 illustrates in plan view section 2—2 of FIG. 1. FIG. 2 illustrates the uniform radial spacing arrangement of heater lamps 127 within inner and outer arrays 160 and 180 of lower heater system 119 which, in accordance with the present invention, are separated by mid-reflector 185. FIG. 2 also illustrates the concentric, symmetric character of peripheral reflector 145, mid-reflector 185, central reflector 150 and inner and outer arrays 160 and 180. The generally annular shape of inner and outer directed radiation regions 156 and 158 is also shown. Mid-reflector 185 is shown with a converging inner face first facet 191 which is presented in the plan view of FIG. 2.

As described in U.S. Pat. No. 5,179,677 entitled "Apparatus and Method for Substrate Heating Utilizing Various Infrared Means to Achieve Uniform Intensity" some lamps may be provided with focusing reflectors 131 which are described in more detail with respect to FIG. 4 below. The remaining heater lamps 127 of FIG. 2 are provided with dispersive reflectors which are described with respect to FIGS. 5 and 6 below. The dispersive and focusing reflectors of the individual lamps are elongated having a major dimension extending the length of the filament in the adjacent heater lamp, and a minor dimension extending traverse to the filament.

Referring again to FIG. 2 and in another aspect of the present invention, focusing reflectors 131 of inner array 160 form a first collection of generally concave reflectors associated with a first collection of heating lamps for directing heating radiations in a first radiation pattern across center region 20 or towards the center most portion of inner radiation direction region 156. The dispersive reflectors and associated lamps 127 of inner array 160 form a second collection of generally flat reflectors associated with a second collection of heater lamps for directing heating radiations in a second radiation pattern around the outer edge of inner directed radiation region 156 or to a region between center region 20 and mid-radius region 30. In a similar fashion, focusing reflectors 131 of outer array 180 form a third collection of generally concave reflectors associated with a third collection of heating lamps for directing heating radiations in a third radiation pattern across periphery region 40 or to a region between periphery region 40 and mid-radius region 30 or towards the center most portion of outer directed radiation region 158. The dispersive reflectors and associated lamps 127 of outer array 180 form a fourth collection of generally flat reflectors associated with a fourth collection of heater lamps for directing heating radiations in a fourth radiation pattern towards the outer edge of outer directed radiation region 158 or to mid-radius region 30 or to periphery region 40.

Although FIG. 2 shows eight of the heater lamps 127 in inner array 160 and 16 of the heater lamps 127 in outer array 180 and indicates that every other one (i.e. 4 and 8 respectively ) of them is provided with a focusing reflector 131, it will be understood that such is for illustrative purposes only, and that the teachings of the present invention extend to any number of heater lamps 127 and focusing reflectors 131. For instance, the dispersive reflectors forming the second and fourth collections of reflectors may outnumber the focusing reflectors forming the first and third collection of reflectors for a correspondingly selected first and second facets of mid-reflector inner and outer surfaces 190 and 186 because the edge area serviced by the dispersive reflectors is much larger than the area serviced by the focusing reflectors. Additionally, the number of bulbs in inner and outer arrays need not be symmetrical. For example, an outer array may comprise 32 lamps while an inner array may comprise 12 lamps.

Figure 3:
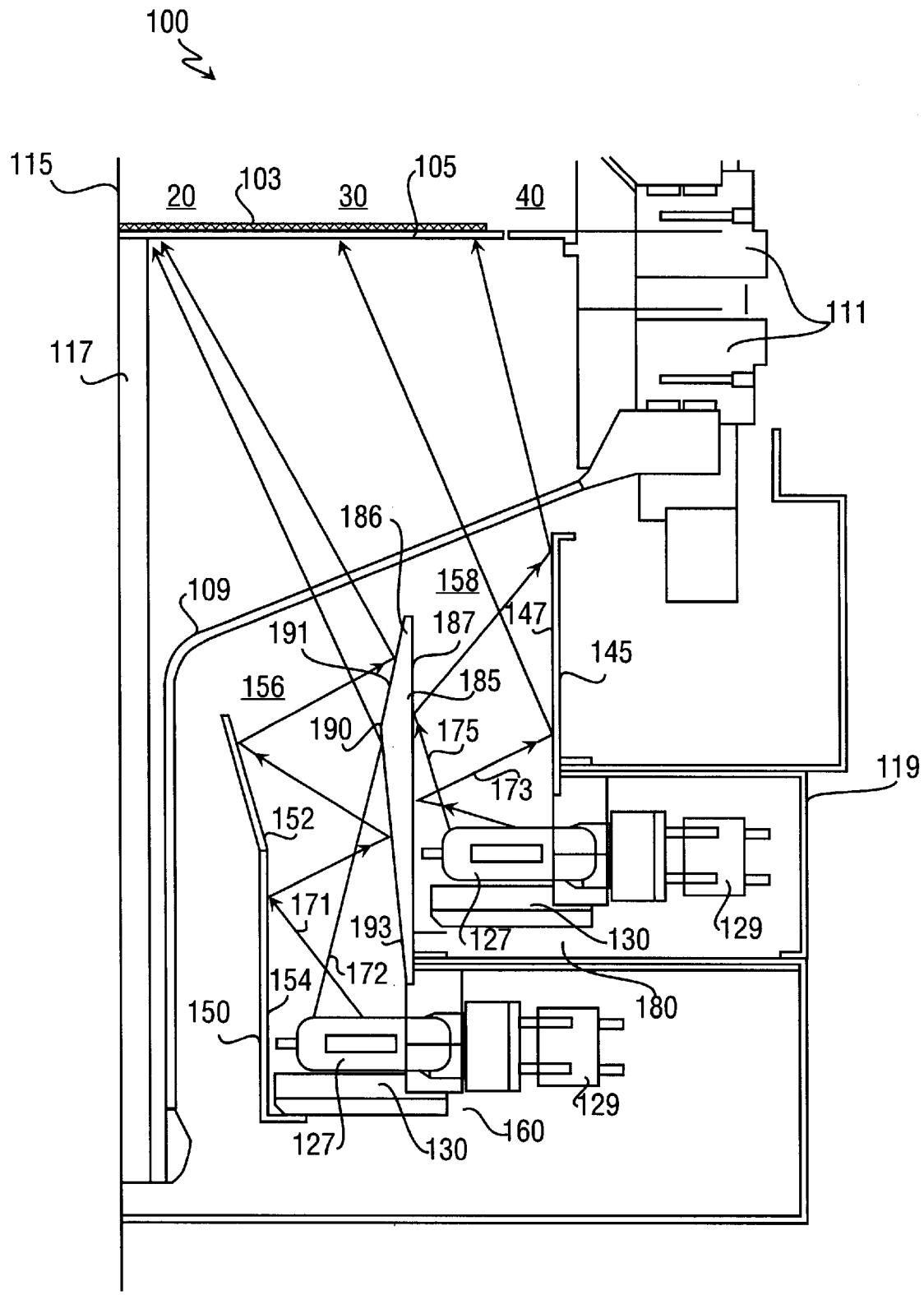
FIG. 3 is partial sectional view X—X of the representative radial lamp array of FIG. 1 illustrating directed ray patterns typical of the present invention.

Turning now to FIG. 3, the directed radiation characteristics of mid-reflector 185 can be better appreciated. FIG. 3 is a partial sectional view of the lower portion of reactor 100 and more specifically, a section of lower heater 119. Although illustrated in cross-section as individual pieces, peripheral reflector 145, mid-reflector 185 and central reflector 150 are continuous, symmetric and concentric about cylindrical axis of symmetry 115. Mid-reflector inner and outer surfaces 190 and 186, peripheral reflector inner surface 147 and central reflector inner surfaces 152 and 154 are formed from rigid, thermally durable materials by casting, machining or like fabrication methods. For example, mid-reflector 185 could be fabricated from a single aluminum cast whose surfaces are then machined into the specific geometric shapes of inner and outer surfaces 190 and 186. After fabrication, the surfaces are plated or coated with a material reflective to infrared radiation such as a thin layer of, for example, gold or copper.

As shown in FIG. 3, inner directed radiation region 156 is bounded by mid-reflector inner surface 190 comprising first and second facets 191 and 193 and central reflector 150 reflective facets 152 and 154. Using angle reference system 50 of FIG. 1A, it is to be appreciated that mid-reflector inner face first facet 191 diverges about 18 degrees away from axis 115 while mid-reflector inner face second facet 193 converges about 7 degrees towards axis 115. Additionally, second facet 193 is longer than first facet 191. Central reflector first facet 152 converges about 15 degrees towards axis 115 while second facet 154 is substantially parallel to axis 115.

The radiation pattern from bulbs 127 of inner array 160 is complex and difficult to analyze. Those rays within inner directed radiation region 156 which are parallel to symmetric axis 115 will likely radiate directly onto substrate 105 without interacting with either mid-reflector 185 or central reflector 150. However, some rays, even though parallel, will intersect mid-reflector inner face 190 when, as shown in FIG. 3, facet 193 converges. Although parallel rays generally are not influenced by mid or central reflectors, these rays can be successfully directed through the advantageous use of focusing or dispersive reflectors as described in relation to FIG. 2. Focusing and dispersive reflectors are described in greater detail with regard to FIGS. 4, 5 and 6 below.

Returning to FIG. 3, those rays generated within inner directed radiation region 156 which are not parallel to symmetric axis 115 will likely intersect mid-reflector inner surface 190 or a reflective surface of central reflector 150. Another aspect of the present invention is the advantageous selection of a length and angle of convergence or divergence for each mid-reflector facet which results in non-parallel beams generated within inner array 160 being directed towards substrate support 105. The path of a first representative non-parallel beam 172 illustrates how a non-parallel beam from a bulb 127 within inner array 160 may be directed towards substrate 103 or substrate support 105. Non-parallel beam 172 intersects a point along the advantageously diverged mid-reflector second facet 193 which reflects beam 172 towards central region 20.

Another aspect of the present invention is the advantageous selection of both central reflector 150 facets 152 and 154 and inner mid-reflector facets 191 and 193 which results in non-parallel beams generated within inner array 160 being directed towards substrate support 105. As shown in FIG. 3, second representative non-parallel beam 171 first intersects and reflects off central reflector second facet 154 towards the convergent mid-reflector second facet 193. Beam 171 is reflected towards convergent central reflector first facet 152 which reflects beam 171 to divergent mid-reflector first facet 191. From divergent mid-reflector first facet 191 beam 171 travels towards and is incident upon susceptor 105. Although described above with respect to multiple reflections first off central reflector 150 then off mid-reflector 185 or a single reflection off mid-reflector 185, one of ordinary skill in the art will appreciate that these are generalizations of the difficult to analyze and complex reflective patterns created within inner directed region 156. Additionally, it will be appreciated that advantageous results are also obtained by multiple reflections first off mid-reflector 185 and then off central reflector 150 as well as those single reflections off central reflector 150 which produce the advantageous result of channeling or directing divergent, non-parallel radiant energy from inner array 160 towards substrate support 105. More specifically, inner directed radiation region 156 can be optimized to direct radiation onto particular regions of substrate support 105, for example, onto central region 20 or mid-radius region 30.

Also shown in FIG. 3 is outer directed radiation region 158 which is bounded by peripheral reflector reflective surface 147 and mid-reflector outer surface 186 shown comprising only a single facet 187 and. Using angle reference system 50 of FIG. 1A, mid-reflector outer face facet 187 diverges about 3 degrees from axis 115 while peripheral reflector surface 147 is shown substantially parallel to axis of symmetry 115.

The radiation pattern from bulbs 127 of outer array 180 is also complex and difficult to analyze. Those rays within outer directed radiation region 158 which are parallel to symmetric axis 115 will likely radiate directly onto substrate 105 without any or only slight interaction with mid-reflector 185 or peripheral reflector 145. Similar to the rays generated by inner array 160, parallel rays generated by the outer array 180 can also be successfully directed onto susceptor 105 through the advantageous use of focusing or dispersive reflectors in place of individual reflectors 130.

Although not illustrated in FIG. 3, but an aspect of the present invention, mid-reflector 185 could have an outer surface 186 comprising two facets 187 and 189. Alternative mid-reflector 185 embodiments are further illustrated and will be further described in relation to FIGS. 1, 9, 11 and 12. Referring again to FIG. 3, those rays generated within outer directed radiation region 158 which are not parallel to symmetric axis 115 will likely intersect mid-reflector outer surface 187 or peripheral reflective surface 147. Non-parallel beams generated within outer array 180 are directed towards predetermined regions of substrate support 105 through the advantageous selection of a length and angle of convergence or divergence for each mid-reflector outer surface facet. The paths of representative non-parallel beams 173 and 175 illustrate how non-parallel beams generated by outer array 180 may be directed towards substrate 103 or substrate support 105. As shown in FIG. 3, a representative non-parallel beam 175 first intersects and reflects off the advantageously diverging mid-reflector outer face facet 187 towards peripheral reflector reflective surface 147. From peripheral reflective surface 147 beam 175 travels towards and is incident upon substrate support 105 or, more specifically, towards periphery region 40 or to mid-radius region 30. Although non-parallel beam 173 intersects at a different point along advantageously diverging mid-reflector outer face 186, beam 173 is also directed to reflective surface 147 and then onto substrate support 105. Non-parallel beams could also intersect the advantageously diverging mid-reflector outer surface 186 at lower angles of incidence such that the beams are directly reflected towards substrate support 105.

Although described above with respect to multiple reflections first off mid-reflector 185 then off peripheral reflector 145, one of ordinary skill in the art will appreciate that these are generalizations of the difficult to analyze and complex reflective patterns created within outer directed radiation region 158. Additionally, it will be appreciated that multiple reflections first off peripheral reflector surface 147 and then off mid-reflector outer surface 186 as well as by single reflections off either mid-reflector outer surface 186 or peripheral reflector surface 147 will also produce the advantageous result of channeling or directing divergent, non-parallel radiant energy from outer array 180 towards substrate support 105. More specifically, outer directed radiation region 158 can be optimized to direct radiation onto periphery region 40 or mid-radius 30 or to a region between periphery region 40 and mid-radius region 30.

Figure 4:
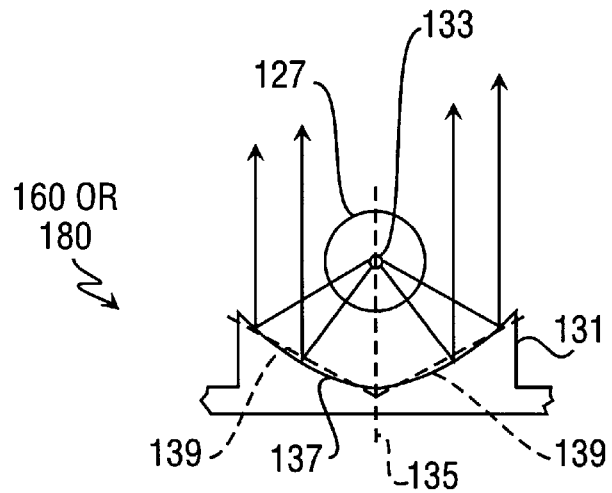
FIG. 4 is sectional view illustrating a single heater lamp in combination with a focusing reflector.

Turning now to FIG. 4, a single lamp 127 together with its associated focusing reflector 131 are illustrated in cross section. Focusing reflector 131 could be substituted for the generic shaped reflector 130 illustrated in FIG. 1. As indicated, reflector 131 utilized by inner or outer array 160 or 180 and is formed from aluminum as an integral part of an extended reflector array 160 or 180, for example, by processes of casting, machining and the like, followed by plating with a thin layer of gold or other material reflective to infrared radiation.

Each point along linear filament 133 of lamp 127 produces thermal radiation uniformly in all directions. A portion of the radiations from any given point extend radially within a plane transverse to the axis of the filament (normal to the plane of the drawing). However, only the rays which strike focusing reflector 131 have been illustrated in FIG. 4. As can be seen in FIG. 4, these rays emerge, after reflection, parallel to one another and to an axis normal to the reflector array 160 or 180, as represented by dotted line 135 in FIG. 4.

Such a radiation pattern is produced by forming the surface 137 of reflector 131 such that it has an essentially parabolic cross-section and by locating filament 133 at the focal axis of the parabola. The rays are reflected generally parallel to the central plane of symmetry of the parabola or simulated parabola which extends downwardly through the focal axis and generally normal to the susceptor. Each parabolic reflector produces a band of generally parallel radiation which can be utilized to heat a predetermined region of substrate support 105 such as, for example, the periphery region 40 or center region 20 of substrate support 105. The portion of substrate support 105 which is heated also depends upon the location of the lamp 127 and the reflector 131 within array 160 or 180 and the specific orientation of the reflecting surfaces within radiation directing regions 156 and 158. Each band of radiation contributes to the heating of the substrate support region normal to the heater array. The planes of symmetry of the other parabolic reflectors also extend generally normal to susceptor 105.

However, much of the total thermal radiation generated by filament 133 will not follow the paths which are illustrated in FIG. 4. In particular, approximately ⅔ of the radiation of filament 133 does not impinge upon surface 137, since this surface, as illustrated subtends an angle of only about 120 degrees at filament 133. Moreover, some of the thermal radiation striking surface 137 travels along ray paths which are not normal to the axis of filament 133. This radiation also will not be focused in accordance with FIG. 4.

For these reasons, the radiation pattern produced by focusing reflector 131 is much for complex than illustrated in FIG. 4, and the accurate focusing of the indicated rays along the paths which are parallel to the axis of the reflector array is not of critical concern. Accordingly, in the interests of economy, it is practical to roughly approximate the complex shape of a parabola by the use of a surface formed by intersecting planes, illustrated by dotted lines 139 in FIG. 4. Similarly, although not illustrated, another general approximation of a parabolic cross section can be achieved by the use of intersecting surfaces which are portions of circular cylinders.

Figure 5:
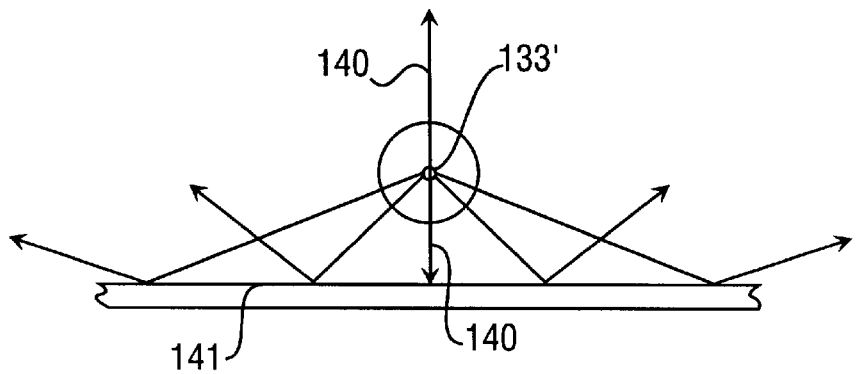
FIG. 5 is sectional view illustrating a single heater lamp in combination with a planar dispersive reflector.

Turning now to FIG. 5, the radiation pattern produced by a planar type of dispersive reflector 141 is illustrated. FIG. 5 considers only those rays 140 which travel along paths normal to filament 133'. As can be seen, only those rays 140 which strike reflector 141 nearly normal thereto are reflected in a direction generally normal to the reflector arrays 160 and 180, since reflector 141 has no converging or focusing effect.

Figure 6:
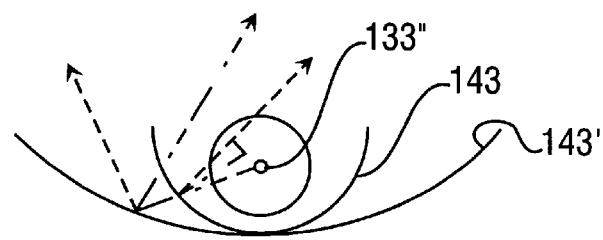
FIG. 6 is sectional view illustrating a single heater lamp in combination with a cylindrical dispersive reflector.

FIG. 6 illustrates the pattern produced when the regions of inner or outer reflector arrays between focusing reflectors 131 are formed as cylinders of circular cross-section. As can be seen, the particular radius of curvature and filament position illustrated in FIG. 6 have resulted in dispersion of the reflected rays. However, if the radius of curvature of surface 143 in FIG. 6 were to be increased (as indicated by surface 143'), the pattern of reflected rays would first pass through a condition of approximate parallelism as the parabolic focus moved relative to surface 143, and then change to divergence. The actual degree of dispersion produced by the dispersive reflector of FIG. 6 will therefore depend on upon the radius of curvature of cylindrical surface 143 and upon the location of filament 133" with respect to surface 143.

FIG. 7 is a table summarizing the alternative mid-reflector 185 embodiments illustrated in FIGS. 1, 8, 9, 10, 11 and 12. Angle measurements discussed below are stated according to angle reference system 50 of FIG. 1A shown on each figure. Returning now to FIG. 1, mid-reflector 185 is shown in a preferred "Diverging, Equal Compound" configuration according to the present invention. In the mid-reflector 185 embodiment of FIG. 1, mid-reflector outer face 186 comprises a first facet 187 diverging about 5 degrees from axis 115 and a second facet 189 which is substantially parallel to axis 115. First and second facets 187 and 189 are approximately the same length and together with peripheral reflector surface 147 create an outer directed radiation zone 158. Mid-reflector inner surface 190 comprises a first facet 191 diverging about 20 degrees from axis 115 and a second facet 193 converging about 20 degrees towards axis 115. First and second mid-reflector inner face facets 191 and 193 are approximately the same length and together with central reflector surfaces 152 and 154 comprise inner directed radiation region 156.

Although central reflector inner surfaces 152 and 154 are similarly embodied in these alternative embodiments of mid-reflector 185, another aspect of the present invention includes alternative embodiments of central reflector 150. Central reflector 150 alternative embodiments include, for example, varying the length of each surface 152 and 154 as well as converging or diverging each surface with respect to inner directed radiation region 156. Thus, it is an aspect of the present invention to alter the reflective and directive characteristics of inner directed radiation region 156 by modifying mid-reflector inner surface 190 alone or in combination with alternative embodiments of central reflector 150 reflective surfaces 152 and 154.

Figure 8:
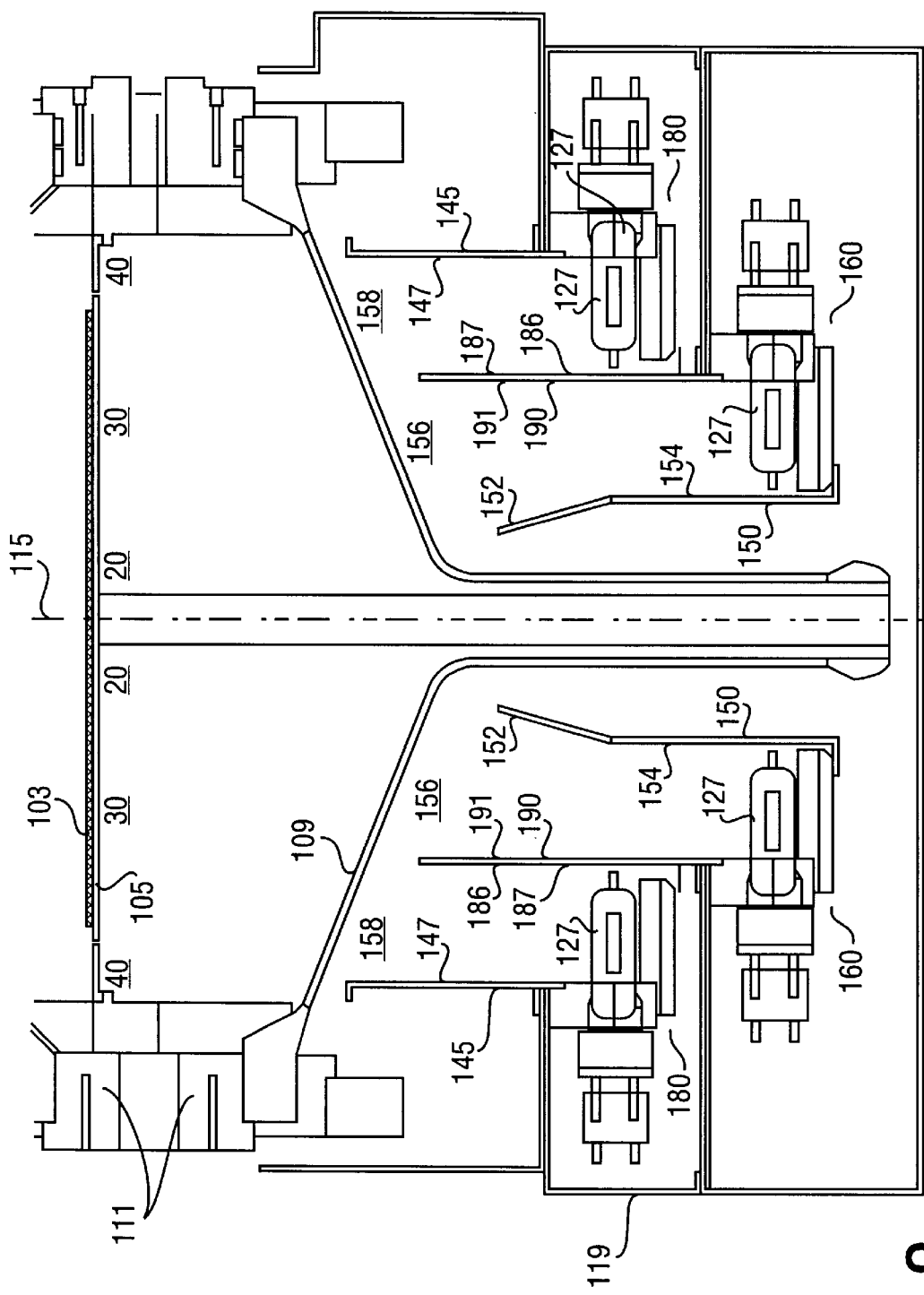
FIG. 8 is a sectional view of the lower portion of the processing reactor of FIG. 1 illustrating a double, parallel embodiment of a dual surfaced reflector according to the present invention.

Turning now to FIG. 8, an alternative double, parallel configuration embodiment of mid-reflector 185 of the present invention can be better appreciated. This configuration is referred to as a double parallel configuration since the first and second faces of mid-reflector 185 are parallel. In the mid-reflector embodiment of FIG. 8, mid-reflector outer face 186 comprises a single facet 187 which is substantially parallel to axis 115. Facet 187 and peripheral reflector surface 147 create an outer directed radiation zone 158. Mid-reflector inner surface 190 comprises a single facet 191 which is substantially parallel to normal or axis 115. Mid-reflector inner face facet 191 together with central reflector surfaces 152 and 154 comprise inner directed radiation region 156.

Figure 9:
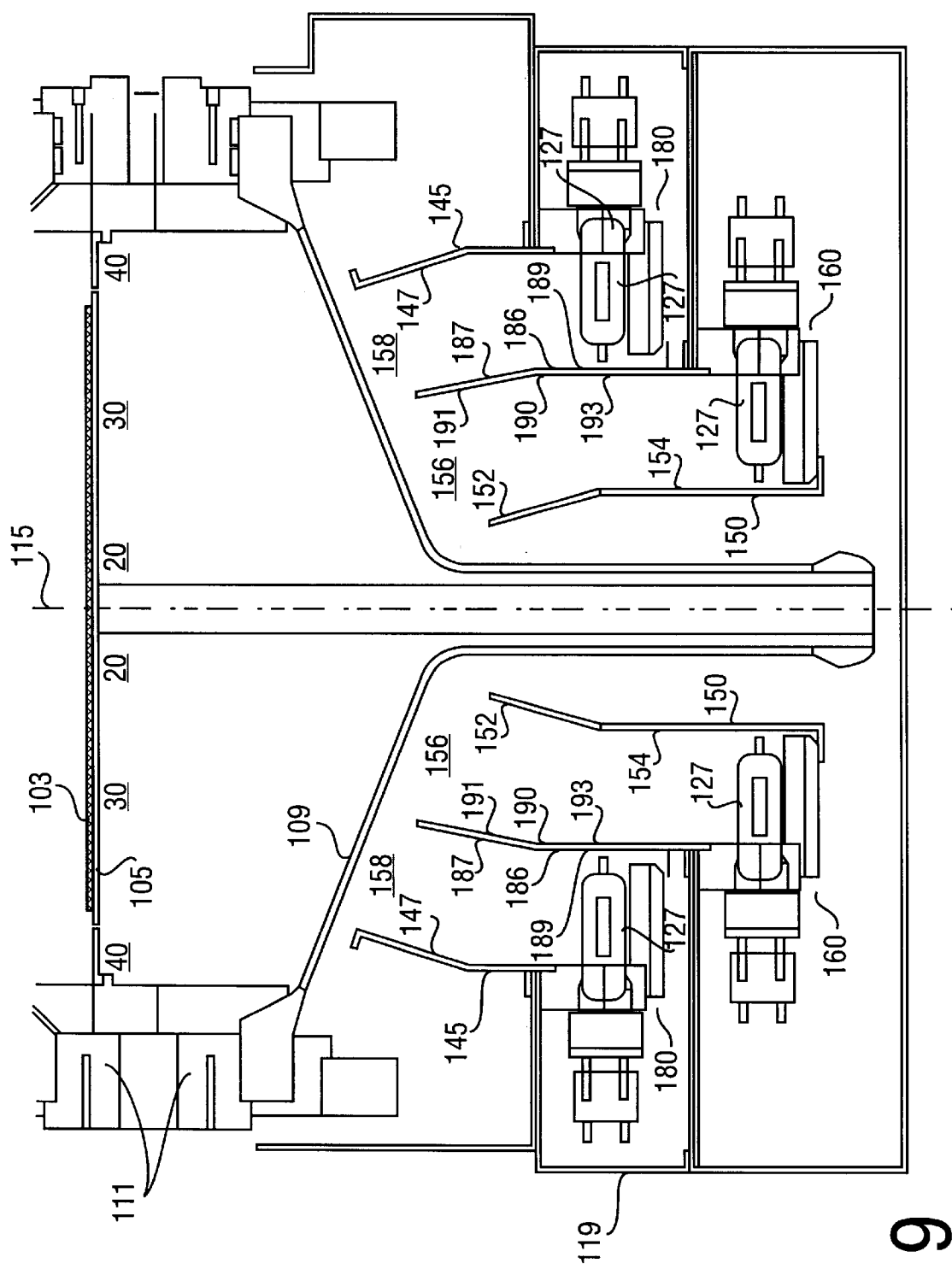
FIG. 9 is a sectional view of the lower portion of the processing reactor of FIG. 1 illustrating a double, converging embodiment of a dual surfaced reflector according to the present invention.

Turning now to FIG. 9, an alternative double, converging configuration embodiment of mid-reflector 185 of the present invention can be better appreciated. This configuration is referred to as a double converging configuration since the first facet of both inner 190 and outer 186 faces of mid-reflector 185 converge towards axis 115. In the mid-reflector 185 embodiment of FIG. 9, mid-reflector outer face 186 comprises a first facet 187 converging about 10 degrees towards axis 115 and a second facet 189 which is substantially parallel to axis 115. First and second facets 187 and 189 are approximately the same length and together with peripheral reflector surface 147 create an outer directed radiation zone 158.

Also illustrated in FIG. 9 is an alternative embodiment of peripheral reflector 145 where reflector surface 147 is formed by an upper convergent surface and a lower parallel surface. Such an peripheral reflector configuration may be used, for example, when a larger diameter outer array 180 is desired. A larger diameter outer array 180 could accommodate an increased number of lamps 127 and the convergent reflective surface 147 could be employed to direct the energy from the larger diameter outer array 180 onto the periphery of substrate support 105 and substrate 103.

Mid-reflector inner surface 190 comprises a first facet 191 converging about 10 degrees towards axis 115 and a second facet 193 substantially parallel to axis 115. First and second mid-reflector inner face facets 191 and 193 are approximately the same length and together with central reflector surfaces 152 and 154 comprise inner directed radiation region 156.

Figure 10:
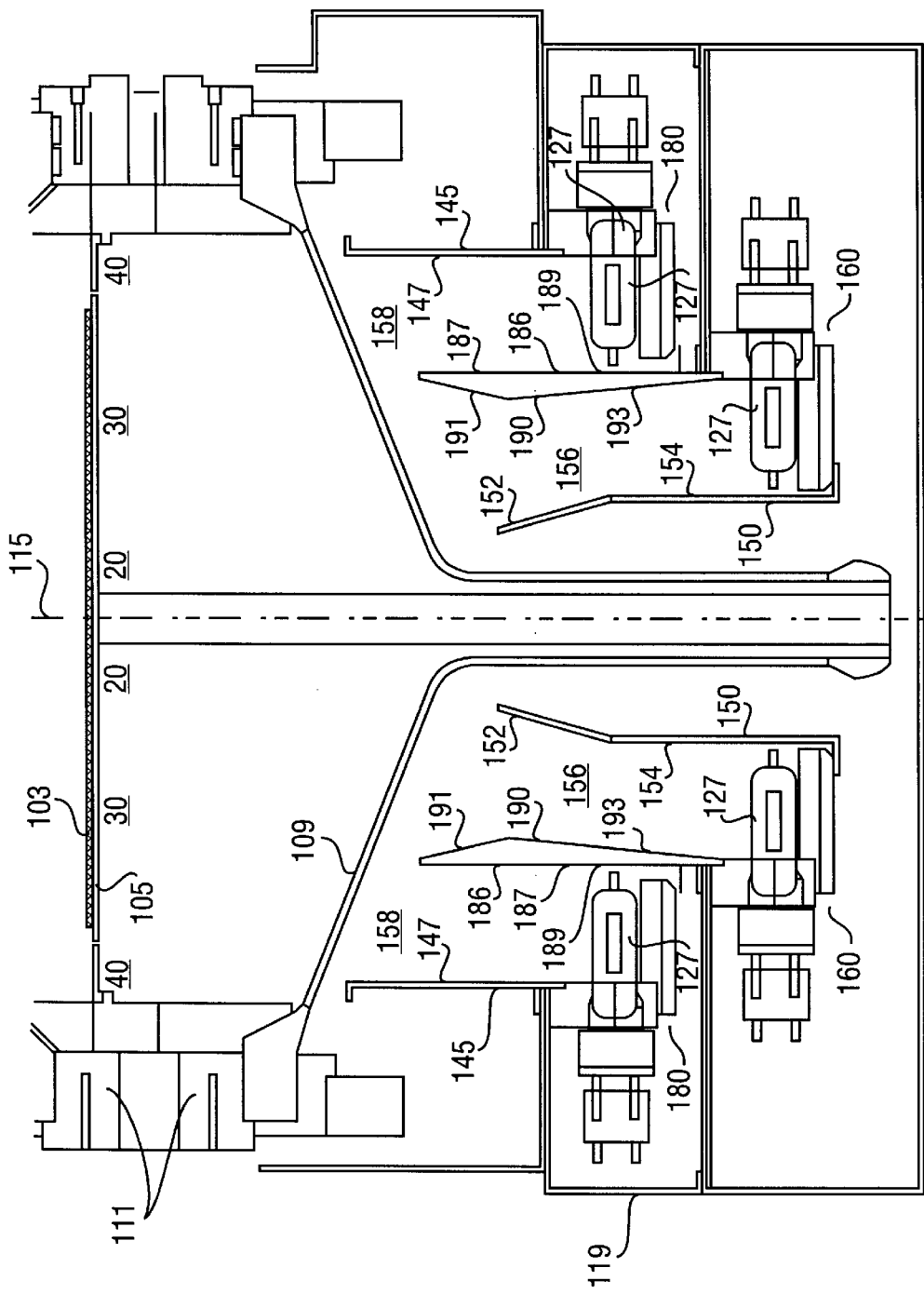
FIG. 10 is a sectional view of the lower portion of the processing reactor of FIG. 1 illustrating a diverging, compound embodiment of a dual surfaced reflector according to the present invention.

Turning now to FIG. 10, an alternative diverging, compound configuration embodiment of mid-reflector 185 of the present invention can be better appreciated. This configuration is referred to as divergent compound configuration since mid-reflector outer surface 186 diverges away from axis 115 while, at the same time, mid-reflector inner surface 190 includes both converging and diverging (i.e., compound) facets. In the mid-reflector embodiment of FIG. 10, mid-reflector outer face 186 comprises a first facet 187 diverging about 3 degrees from axis 115 and a second facet 189 which is substantially parallel to axis 115. First and second facets 187 and 189 are approximately the same length and together with peripheral reflector surface 147 create an outer directed radiation zone 158. Mid-reflector inner surface 190 comprises a first facet 191 diverging about 18 degrees from axis 115 and a second facet 193 converging about 5 degrees towards axis 115. Second mid-reflector inner face facet 193 is longer than first facet 191. Also shown in FIG. 10 is an alternative embodiment of central reflector 150 which includes a single reflective surface 154 parallel to the axis of symmetry 115. Thus, first and second inner mid-reflector facets 191 and 193 together with central reflector surface 154 comprise inner directed radiation region 156.

Figure 11:
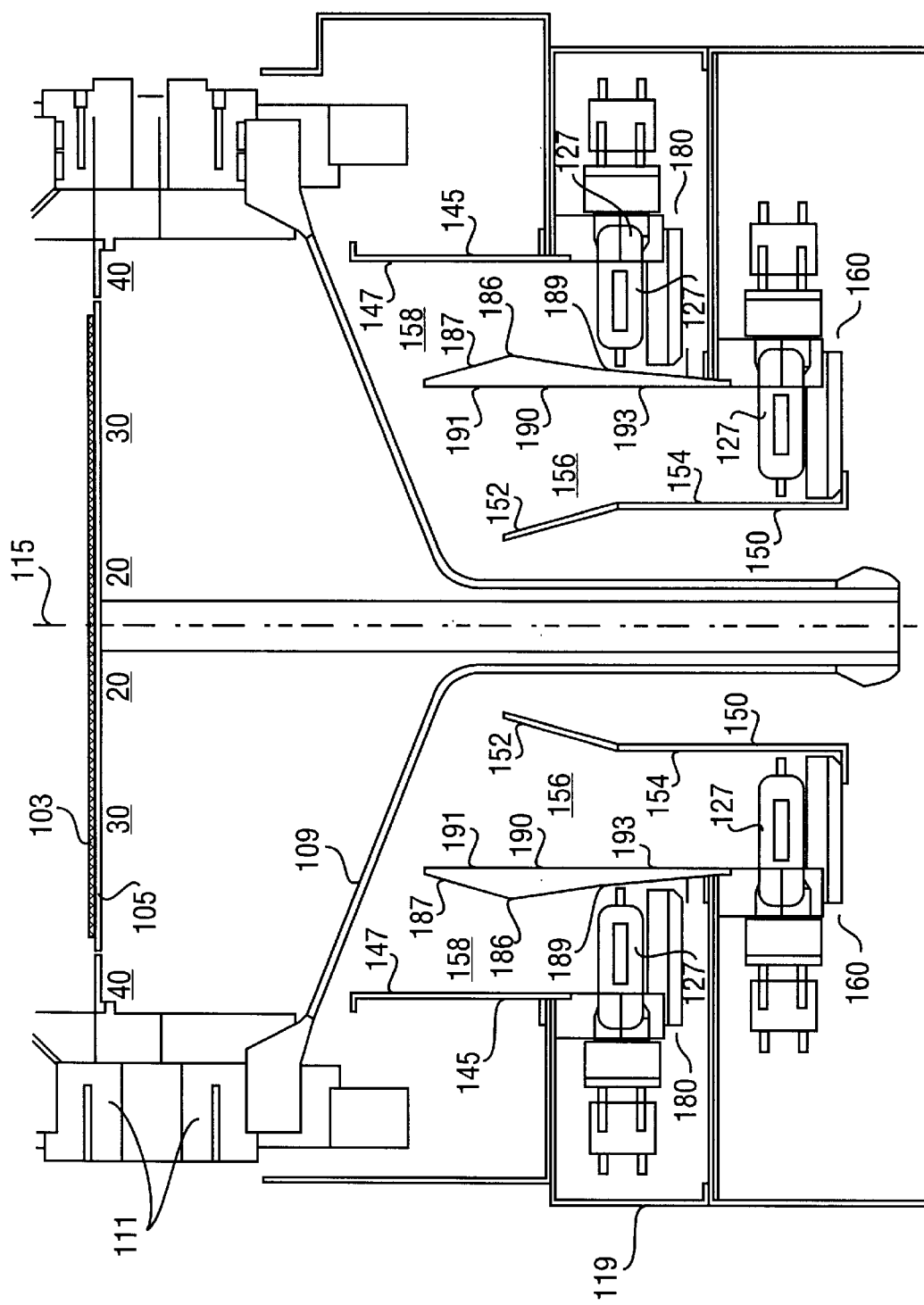
FIG. 11 is a sectional view of the lower portion of the processing reactor of FIG. 1 illustrating a compound, converging embodiment of a dual surfaced reflector according to the present invention.

Turning now to FIG. 11, an alternative compound, convergent configuration embodiment of mid-reflector 185 of the present invention can be better appreciated. This configuration is referred to as an compound convergent configuration since mid-reflector outer surface 186 presents both convergent and divergent (i.e., compound) facets while, at the same time, mid-reflector inner surface 190 presents a convergent facet. In the mid-reflector embodiment of FIG. 11, mid-reflector outer face 186 comprises a first facet 187 converging about 18 degrees towards axis 115 and a second facet 189 which is diverging about 6 degrees from axis 115. Second facet 189 is longer than first facet 187. First and second facets 187 and 189 together with peripheral reflector surface 147 create an outer directed radiation zone 158. Mid-reflector inner surface 190 comprises a first facet 191 converging about 3 degrees towards axis 115 and a second facet 193 substantially parallel to axis 115. First and second mid-reflector inner face facets 191 and 193 are approximately the same length and together with central reflector surfaces 152 and 154 comprise an inner directed radiation region 156.

Figure 12:
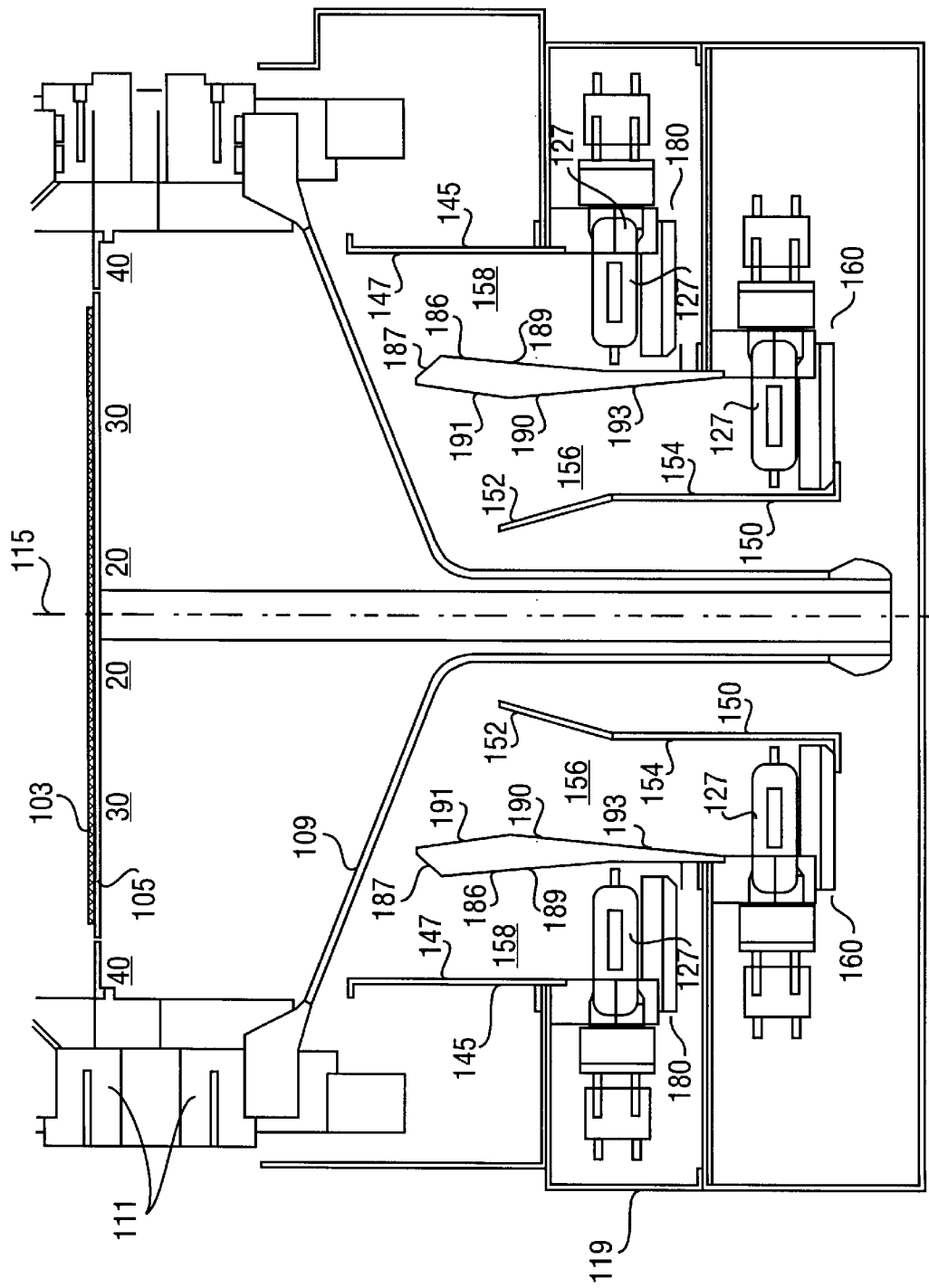
FIG. 12 is a sectional view of the lower portion of the processing reactor of FIG. 1 illustrating a double, compound embodiment of a dual surfaced reflector according to the present invention.

Turning now to FIG. 12, an alternative double, compound configuration embodiment of mid-reflector 185 of the present invention can be better appreciated. This configuration is referred to as a double compound configuration since mid-reflector outer surface 186 comprises both converging and diverging (i.e., compound) facets while, at the same time, mid-reflector inner surface 190 also comprises both converging and diverging (i.e., compound) facets. In the mid-reflector embodiment of FIG. 12, mid-reflector outer face 186 comprises a first facet 187 converging about 30 degrees towards axis 115 and a second facet 189 which is longer than first facet 187 and diverging about 8 degrees from axis 115. First and second facets 187 and 189 together with peripheral reflector surface 147 create an outer directed radiation zone 158. Mid-reflector inner surface 190 comprises a first facet 191 diverging about 18 degrees from axis 115 and a second facet 193 which is longer than first facet 191 and converging about 10 degrees towards axis 115. First and second mid-reflector inner face facets 191 and 193 together with central reflector surfaces 152 and 154 comprise inner directed radiation region 156.

Although the aforementioned embodiments are described in relation to heater arrays and reflected regions created within lower heater assembly 119, the embodiments of the present invention are readily applicable to heater arrays disposed within upper heater assembly 121. As such, another aspect of the present invention is the application of the various embodiments of the present invention to upper heater assembly 121 in order to direct radiation generated by inner and outer heater arrays 160 and 180 within assembly 121 to produce uniform radiation patterns on substrate 103 and substrate support 105 from above. It is also to be understood that a reactor 100 may also have a single lamp array disposed in an upper heater assembly 121 while multiple heater arrays employing mid-reflectors according to the present invention are disposed within lower heater assembly 119. More specifically, the various embodiments of the present invention may be employed to provide specific thermal profiles across a substrate 103 as well as induce thermal gradients between a substrate 103 and susceptor 105.

From the foregoing discussions, it will be apparent that the pattern of radiation from each lamp and its associated reflector is complex and difficult to analyze. However the use of a dual sided mid-reflector alone or in combination with the types of focusing and dispersing reflectors in described above, provides the ability to alter the radiation patterns in such a way that considerable variation can be achieved on an empirical basis. Accordingly, it is possible to select appropriate mid-reflector dimensions, facet lengths and facet angles to optimize thermal uniformity over the surface of the substrate 103 and substrate support 105 from upper heater 121 and the surface of substrate support 105 from lower heater 119.

Returning now to FIG. 1, the radiation pattern produced on substrate support 105 is considerably influenced by the incorporation of a peripheral reflector 145, mid-reflector 185 and central reflector 150 to create inner and outer directed radiation regions which have generally annular shapes and are symmetric about axis 115. Mid-reflector inner and outer surfaces 190 and 186, peripheral reflector surface 145 and central reflector surfaces 152 and 154 are thus positioned to intercept a considerable percentage of the rays traveling along paths which deviate from a direction parallel to axis 115, and to redirect a large percentage of these rays onto predetermined and advantageously selected regions of substrate support 105 and substrate 103.

The creation of inner and outer directed radiation regions 156 and 158 further increases the complexity of analysis of the radiation patterns produced on substrate 103 and substrate support 105, but empirical results show the following:

First, the radiation produced by focusing reflectors 131 is higher in the center most portion (i.e. that portion nearest axis 115) of the directed radiation region than in the peripheral region thereof. This is consistent with the fact that a substantial percentage of the radiation from the focusing reflectors tends towards the center region 20, in the case of inner directed radiation region 156 and towards the mid-radius region 30 in the case of outer directed radiation region 158.

Second, the radiation pattern produced by dispersive reflectors such as planar reflector 141 of FIG. 5 and circular-cylindrical reflector 143 of FIG. 6 utilized within outer radiation region 158 is greater in peripheral region 40 than in the mid-radius region 30. In the case of inner directed radiation region 156, the radiation pattern produced by dispersive reflectors is greater towards mid-radius region 30 than central region 20. This dispersive radiation pattern is consistent with the greater percentage of rays which diverge from a direction parallel to axis 115. Many of these rays impinge on peripheral reflector surface 147 in the case of outer region 158 or on mid-reflector inner surface 190 in the case of inner region 156. As a result, these impinging rays are reflected into a pattern of high radiation density in peripheral region 40, in the case of outer directed radiation region 158, or mid-radius region 30 in the case of inner directed radiation region 156.

Thus, it is apparent that there has been provided, in accordance with the present invention, methods and apparatuses of mid-reflectors which direct radiant energy generated by multiple heater arrays into directed radiation regions in order to provide uniform radiation patterns into advantageously selected regions on substrates and substrate supports. While specific embodiments of the invention have been shown and described, further modifications and improvements will occur to those skilled in the art. It is desired that it be understood, therefore, that this invention is not limited to the particular forms shown and is intended in the appended claims to cover all modifications which do not depart from the spirit and scope of the invention.

I claim:

1. An apparatus for directing radiant energy onto a susceptor, said apparatus comprising:
   (a) a first array of radiant energy sources;
   (b) a second array of radiant energy sources;
   (c) a reflector having a first surface and a second surface wherein said first surface is non parallel with said second surface; and
   (d) a susceptor, wherein
      said reflector is disposed between said first and said second arrays of radiant energy sources so that the energy from said first array of radiant energy sources is directed to said susceptor by said reflector first surface; and
      energy from said second array of radiant energy sources is directed to said susceptor by said reflector second surface.

2. An apparatus according to claim 1 wherein said reflector is positioned between said first radiant energy source and said second radiant energy source.

3. An apparatus according to claim 1 wherein said susceptor further comprises a central region, a mid-radius region and a peripheral region.

4. An apparatus according to claim 3 wherein a portion of said energy from said first radiant energy source is directed towards said susceptor peripheral region.

5. An apparatus according to claim 3 wherein a portion of said energy from said second radiant energy source is directed towards said susceptor central region.

6. An apparatus according to claim 3 wherein a portion of said energy from said first radiant energy source is directed towards said susceptor central region.

7. An apparatus according to claim 3 wherein a portion of said energy from said second radiant energy source is directed towards said susceptor peripheral region.

8. An apparatus according to claim 1 wherein said first and second radiant energy sources are selected from the group consisting of: tungsten filament lamps, mercury vapor lamps and halogen lamps.

9. An apparatus according to claim 1 wherein said susceptor has a diameter of at least 200 mm.

10. An apparatus according to claim 1 wherein the diameter of said susceptor is greater than or equal to about 300 mm.

11. An apparatus according to claim 1 wherein said reflector is a single, continuous structure.

12. An apparatus for heating semiconductor workpieces, said apparatus comprising:
   (a) a susceptor having a central region, a mid-radius region and a peripheral region;
   (b) a first plurality of radially arranged heat lamps;
   (c) a second plurality of radially arranged heat lamps;
   (d) an outer reflector having a reflective surface;
   (e) a mid-reflector having first and second reflective surfaces wherein
said first reflective surface is non parallel with said second reflective surface, said mid-reflector being disposed between said first plurality of radially arranged heat lamps and said second plurality of radially arranged heat lamps; and
   (f) a central reflector having a reflective surface;
      wherein said susceptor and said first and second plurality of lamps, said outer reflective surface, said mid-reflector and said central reflector are coaxial to a common axis of cylindrical symmetry;

wherein said energy produced from said first plurality of lamps is directed by said outer reflector reflective surface and said first reflective surface of said mid-reflector; and wherein said energy produced from said second plurality of lamps is directed by said second reflective surface of said mid-reflector and said central reflector reflective surface.

13. An apparatus according to claim 12 wherein a portion of said lamps in said first and said second plurality of lamps is disposed adjacent to a focusing reflector.

14. An apparatus according to claim 12 wherein a portion of said lamps in said first and said second plurality of lamps is disposed adjacent to a dispersive reflector.

15. An apparatus according to claim 12 wherein said energy from said first plurality of lamps is directed towards said susceptor peripheral region.

16. An apparatus according to claim 12 wherein said energy from said first plurality of lamps is directed towards said susceptor mid-radius region.

17. An apparatus according to claim 12 wherein a portion of said energy from said first plurality of lamps is directed towards said susceptor peripheral and a portion of said energy from said first plurality of lamps is directed towards said susceptor mid-radius region.

18. An apparatus according to claim 12 wherein said energy from said second plurality of energy sources is directed towards said susceptor central region.

19. An apparatus according to claim 12 wherein said energy from said second plurality of energy sources is directed towards said susceptor mid-radius region.

20. An apparatus according to claim 12 wherein a portion of said energy from said second plurality of energy sources is directed towards said susceptor central region and a portion of said energy from said second plurality of energy sources is directed towards said susceptor mid-radius region.

21. A method of inducing a temperature profile on a semiconductor substrate utilizing multiple heater arrays in a processing apparatus, said method comprising the steps of:

(a) generating radiant energy in a first radial array of heat lamps wherein a portion of said heat lamps include focusing reflectors and a portion of said heat lamps include dispersing reflectors;

(b) generating radiant energy in a second radial array of heat lamps wherein a portion of said heat lamps include focusing reflectors and a portion of said heat lamps include dispersing reflectors;

(c) reflecting radiant energy from said first radial array off a first face of a reflective surface having a first face and a second face wherein a portion of first face is non parallel with said second face, said reflector being disposed between said first and said second radial arrays onto a susceptor; and (d) reflecting radiant energy from said second radial array off said second face of said reflective surface that is disposed between said first and said second radial arrays onto a susceptor.

22. The method according to claim 21 wherein the radiant energy generated by said portion of lamps in said first array disposed adjacent to focusing reflectors is directed towards said the center of said susceptor.

23. The method according to claim 21 wherein the radiant energy generated by said portion of lamps in said first array disposed adjacent to dispersive reflectors is directed towards the mid-radius of said susceptor.

24. The method according to claim 21 wherein the radiant energy generated by said portion of lamps in said second array disposed adjacent to focusing reflectors is directed towards the mid-radius region of said susceptor.

25. The method according to claim 21 wherein the radiant energy generated by said portion of lamps in said second array disposed adjacent to dispersive reflectors is directed towards the peripheral region of said susceptor.

26. An apparatus for directing radiant energy comprising:

(a) a first array of radially arranged radiant energy sources;

(b) a second array of radially arranged radiant energy sources;

(c) a reflector having a first face and a second face arranged such that a portion of said first face is non-parallel with said second face;

wherein,
said first and said second arrays of radially arranged radiant energy sources and said reflector are coaxial to a common axis of symmetry; and
said reflector is disposed between said first array and said second array such that said reflector first face directs energy from said first array and said reflector second face directs energy from said second array.

27. An apparatus according to claim 26 wherein a portion of said first face angles towards said axis of symmetry and a portion of said first face angles away from said axis of symmetry.

28. An apparatus according to claim 26 where in portions of said first and said second reflector faces are non-parallel to said common axis of symmetry.

29. An apparatus for directing radiant energy comprising:

(a) a first array of radiant lamps;

(b) a second array of radiant lamps;

(c) a reflector having a first face and a second face;
wherein, said reflector is disposed between said first array and said second array such that said first reflector face is disposed adjacent to said first array and said second face is disposed adjacent to said second array wherein a portion of said first reflective face is non parallel with a portion of said second reflective face; and
said reflector is sufficiently long so that the reflector separates the illuminating portion of the lamps of said first array from the illuminating portion of the lamps of said second array.

30. An apparatus for directing radiant energy comprising:

(a) a first array of radially arranged radiant lamps;

(b) a second array of radially arranged radiant lamps;

(c) a reflector disposed between said first array and said second array,
said reflector having a first face and a second face;
wherein,
said first reflector face is disposed adjacent to said first array and said second reflector face is disposed adjacent to said second array and said first reflector face is non parallel to said second reflector face.

* * * * *